United States Patent [19]

Kamon et al.

[11] Patent Number: 5,144,362
[45] Date of Patent: Sep. 1, 1992

[54] PROJECTION ALIGNER

[75] Inventors: Kazuya Kamon, Itami; Yasuhito Myoi, Amagasaki; Teruo Miyamoto, Amagasaki; Yoshie Noguchi, Amagasaki; Masaaki Tanaka, Amagasaki, all of Japan

[73] Assignee: Mitsubishi Denki Kabushiki Kaisha, Japan

[21] Appl. No.: 790,446

[22] Filed: Nov. 12, 1991

[30] Foreign Application Priority Data

Nov. 14, 1990 [JP] Japan .................................. 2-306238
Jan. 8, 1991 [JP] Japan .................................... 3-11541

[51] Int. Cl.[5] ............................................ G03B 27/42
[52] U.S. Cl. ........................................ 355/53; 355/71
[58] Field of Search ................................... 355/53, 71

[56] References Cited

U.S. PATENT DOCUMENTS

| 3,157,087 | 11/1964 | Kallenberg | 355/71 |
| 3,892,482 | 7/1975 | Weisglass | 355/71 |
| 4,257,086 | 3/1981 | Gulliksen | 355/71 |
| 4,816,876 | 3/1989 | Pryor | 355/71 |
| 4,970,546 | 11/1990 | Suzuki et al. | 355/53 |
| 4,988,188 | 1/1991 | Ohta | 355/53 |

Primary Examiner—Monroe H. Hayes
Attorney, Agent, or Firm—Leydig, Voit & Mayer

[57] ABSTRACT

A projection aligner includes a light source, a condenser lens system for directing light from the light source onto a mask on which a circuit pattern is formed, a projecting lens system for collecting on the surface of a wafer the light transmitted through the mask, and a pupillary member disposed on a pupillary surface of the projecting lens system. The pupillary member includes at least one transmitting zone for transmitting the light transmitted through the mask including a phase shift member for producing a predetermined phase shift in light transmitted through part of the transmitting zone.

17 Claims, 15 Drawing Sheets

PROJECTION ALIGNER

BACKGROUND OF THE INVENTION

1. Field of the Invention

The present invention relates to a projection aligner for use in the process of manufacturing LSIs.

2. Description of the Related Art

FIG. 24 shows a conventional projection aligner. A fly-eye lens 3 is disposed diagonally to of a lamp house 1. A mirror 2 is disposed between the lens 3 and the house 1. An aperture member 4 is positioned in front of the fly-eye lens 3. Condenser lenses 5 and 6, a mirror 7, and an exposure mask 8 on which a desired circuit pattern is formed are arranged along an optical path. A wafer 10 is situated in front of the mask 8, and a projecting lens system 9 is disposed between the mask 8 and the wafer 10. The projecting lens system 9 has a pupillary member 9a disposed on a pupillary surface of the system 9.

As shown in FIGS. 25 and 26, the pupillary member 9a has a disk-like configuration with a circular opening 9b at the center thereof.

Light emanating from the lamp house 1 reaches the fly-eye lens 3 through the mirror 2, and is split into light beams which pass through lenses 3a of the fly-eye lens 3. The light beams transmitted through the respective lenses 3a pass through the opening 4a of the aperture member 4, the condenser lens 5, the mirror 7 and the condenser lens 6, and then irradiate an exposure zone of the mask 8. The light beams transmitted through the lenses 3a of the fly-eye lens 3 are superposed on each other on the surface of the mask 8, and thus the beams irradiate uniformly the surface of the mask 8. In this way, the light beams pass through the mask 8 and reach the wafer 10 through the projecting lens system 9 and the opening 9b of the pupillary member 9a, whereby the circuit pattern is imaged on the surface of the wafer 10.

It is known that the minimum resolution R of such a projection aligner is proportional to $\lambda/NA$, where $\lambda$ is the wavelength being used and NA is the numerical aperture of the optical system. Thus, the optical system has hitherto been designed so that the numerical aperture is increased to improve the resolution of the projection aligner. In recent years the improved resolution copes with a higher degree of integration of LSIs.

It is also known that as the numerical aperture of an optical system increases, the minimum resolution R decreases and the depth of focus (DOF) of the projection aligner also decreases even more than the resolution R does. The DOF is proportional to $\lambda/NA^2$. For this reason, in the conventional projection aligner, the DOF decreases with an increase in the resolution, and the accuracy of transcribing the circuit pattern deteriorates.

SUMMARY OF THE INVENTION

The present invention has been made to solve such a problem. Accordingly, the object of the invention is to provide a projection aligner increasing resolution and enlarging the depth of focus.

In order to achieve the above object, according to this invention, there is provided a projection aligner comprising: a light source; a condenser lens system for directing light from the light source onto a mask on which a circuit pattern is formed; a projecting lens system for collecting on the surface of a wafer the light transmitted through the mask; and a pupillary member disposed on a pupillary surface of the condenser lens system wherein the pupillary member includes at least one transmitting zone for transmitting light transmitted through the mask and a phase shift member for producing a predetermined phase shift in part of the light transmitted through the transmitting zone.

DESCRIPTION OF THE PREFERRED EMBODIMENTS

The embodiments of the present invention will be described below with reference to the accompanying drawings.

Figure 1:
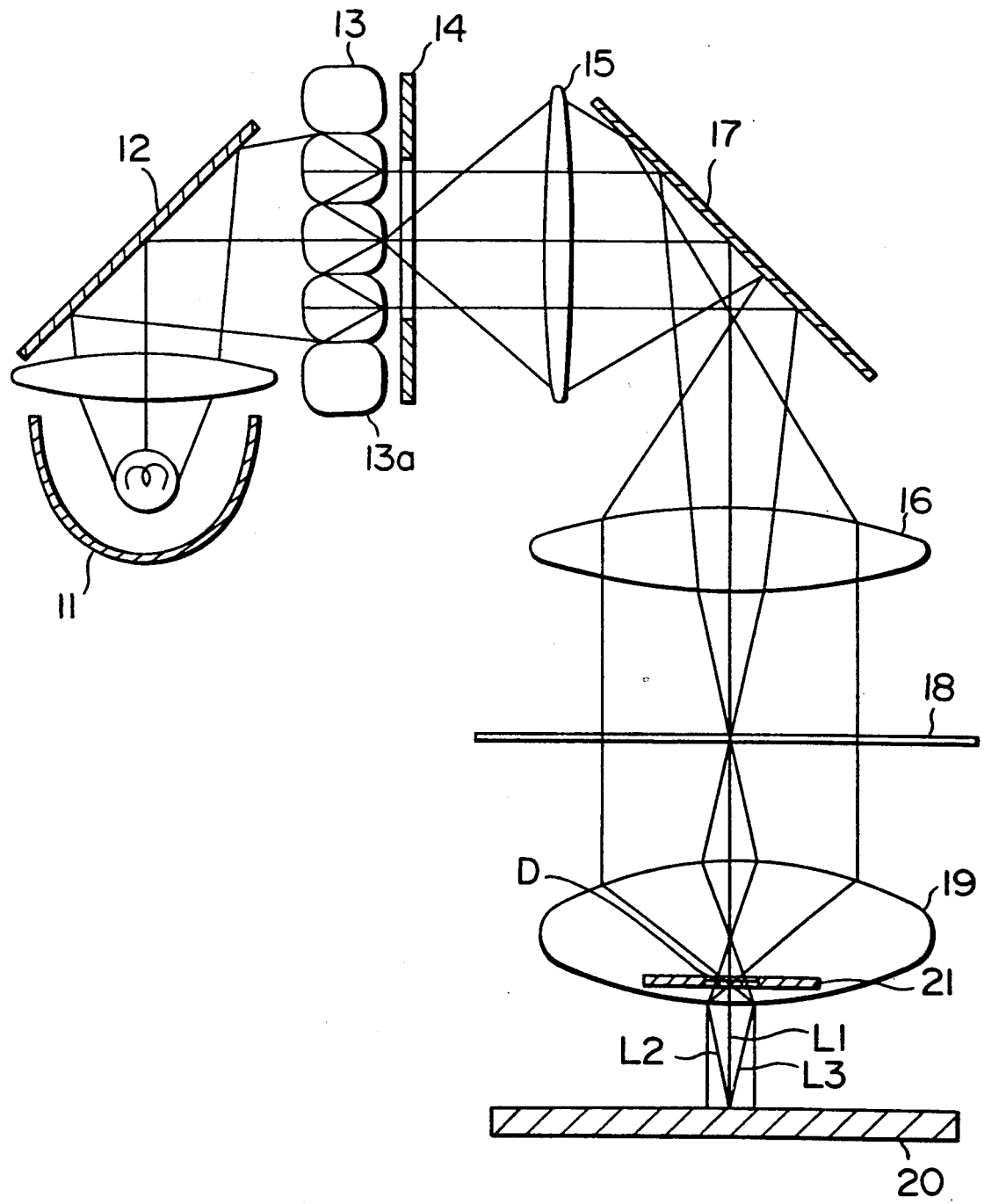
FIG. 1 is a view showing the optical system of a projection aligner in accordance with a first embodiment of the present invention.

FIG. 1 is a view showing the optical system of a projection aligner in accordance with a first embodiment of the invention. A fly-eye lens 13 is disposed diagonally to a lamp house 11 from which a lamp emits light having a wavelength of $\lambda$, and a mirror 12 is disposed between the lens 13 and the house 11. An aperture member 14 is positioned in front of the fly-eye lens 13. Condenser lenses 15 and 16, a mirror 17, and an exposure mask 18 on which a desired circuit pattern is formed are arranged along an optical path. A wafer 20 is situated in front of the mask 18, and a projecting lens system 19 is disposed between the mask 18 and the wafer 20. A pupillary member 21 is disposed on a pupillary surface of the projecting lens system 19.

Figure 2:
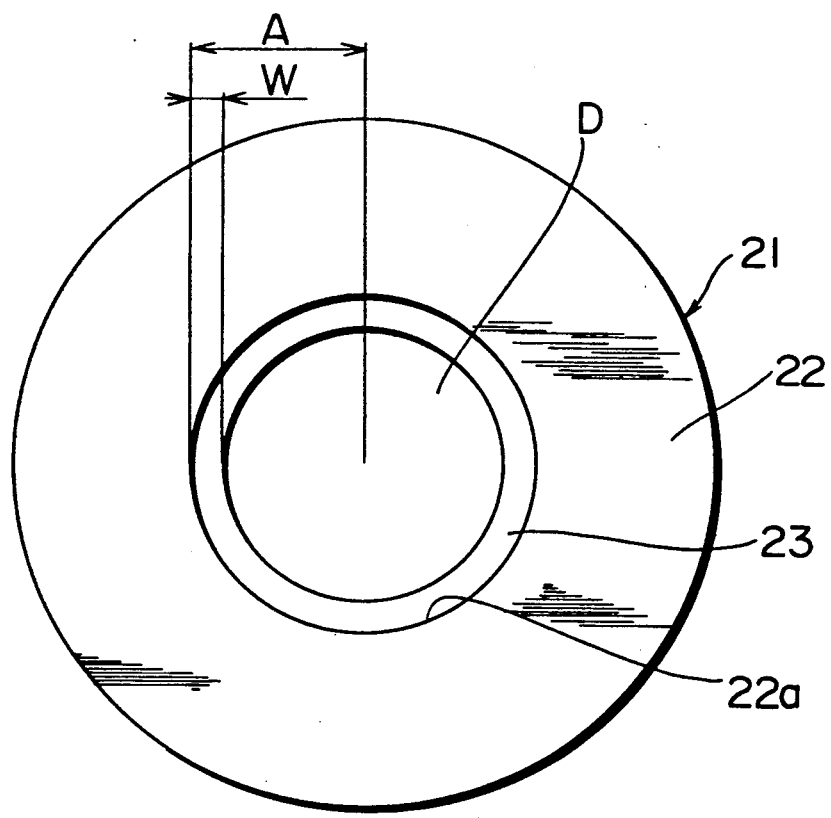
FIG. 2 is a plan view showing a pupillary member used in the first embodiment.
Figure 3:
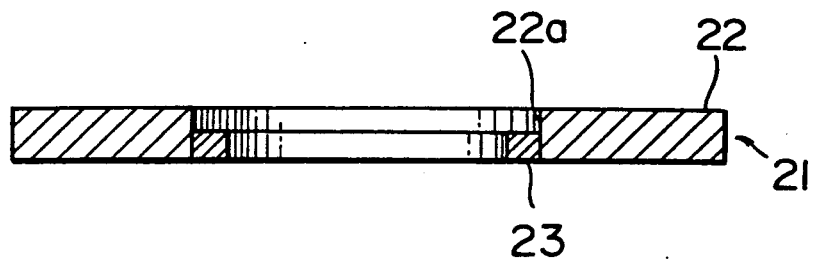
FIG. 3 is a cross-sectional view of the pupillary member shown in FIG. 2.

As shown in FIGS. 2 and 3, the pupillary member 21 has a disk-like outer frame 22 and an annular phase shift member 23 having a width W. A circular opening 22a having a radius A is formed at the center of the frame 22. The phase shift member 23 is formed around the periphery of the opening 22a. The outer frame 22 is formed of a light-intercepting, i.e., opaque member such as metal. The opening 22a forms a transmitting zone D through which light from the lamp house 11 is transmitted. The phase shift member 23 is formed of, for example, $SiO_2$, and is also formed to such a thickness that there is a phase difference of a half-wavelength, $\lambda/2$, between light transmitted through the center of the transmitting zone D, where there is no phase shift member 23 present, and light transmitted through the phase shift member 23.

The operation of this embodiment will now be explained. Light from the lamp house 11 reaches the fly-eye lens 13 through the mirror 12, and is split into light beams which pass through lenses 13a, which constitute the fly-eye lens 13. The light beams transmitted through the respective lenses 13a pass through the aperture member 14, the condenser lens 15, the mirror 17 and the condenser lens 16, and then irradiate an exposure zone of the mask 18. The light beams transmitted through the lenses 13a of the fly-eye lens 13 are superposed on each other on the surface of the mask 18, and thus the beams irradiate uniformly the surface of the mask 18. In this way, the light beams pass through the mask 18 and reach the wafer 20 through the projecting lens system 19 and a transmitting zone D of the pupillary member 21, whereby an image of the circuit pattern is formed on the surface of the wafer 20.

As shown in FIG. 1, because of the phase shift member 23 formed at the periphery of the transmitting zone D of the pupillary member 21, the phases of light beams L2 and L3 transmitted through the phase shift member 23 of the pupillary member 21 are reversed with respect to the phase of light beam L1 transmitted through the center of the transmitting zone D. Therefore, when these light beams L1-L3 collect on the surface of the wafer 20, the light beams L2 and L3 each in a reverse phase interfere with the light beam L1, thus offsetting each other.

Figure 4:
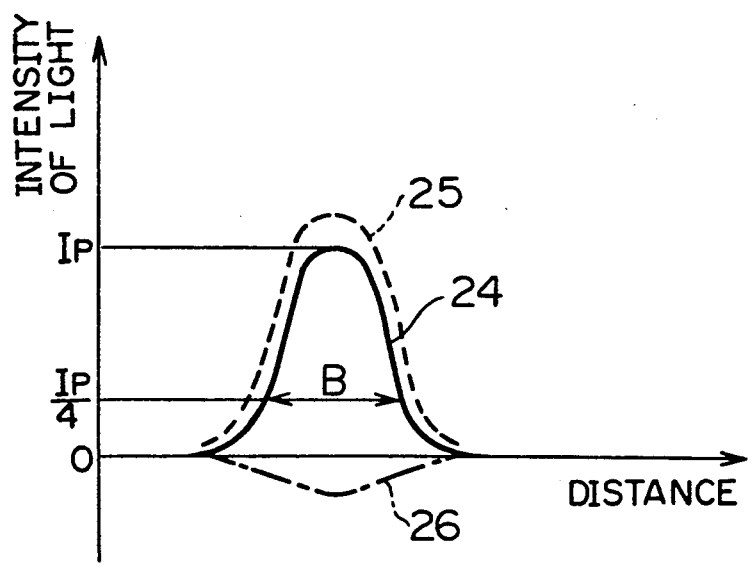
FIG. 4 is a view showing the distribution of the intensity of light on the surface of a wafer when the light is completely focused thereon.

FIG. 4 is a view showing the distribution of the intensity of light on the surface of the wafer when the light beams are completely focused thereon. If the pupillary member 21 were not provided with the phase shift member 23, the distribution would be formed as indicated by a broken line 25. In this embodiment, however, because the pupillary member 21 is provided with the phase shift member 23, the light beam L1 is offset by a reverse component 26 of the light beams L2 and L3, and thus the distribution of the intensity of light is formed as indicated by a solid line 24. It is thus proved that when the lights are completely focused, because of the provision of the phase shift member 23, there is a decrease in the intensity of light, but there is substantially no deterioration in the shape of the distribution of the intensity of light.

Figure 5:
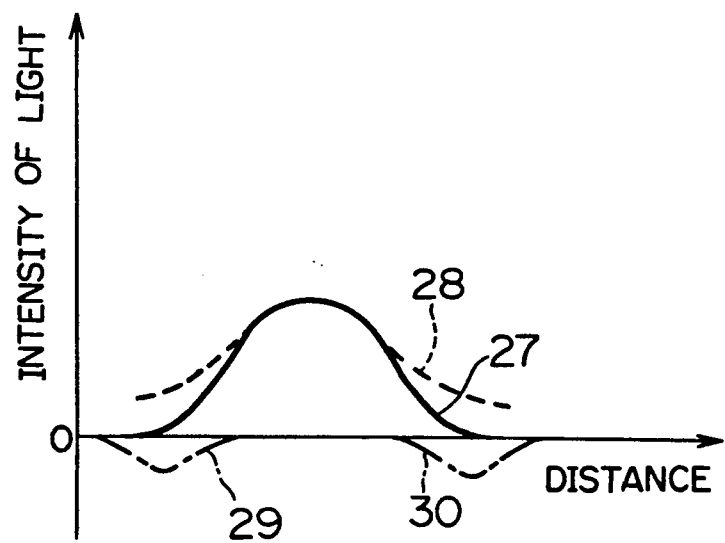
FIG. 5 is a view showing the distribution of the intensity of light on the surface of the wafer when the light is not focused thereon.
Figure 6:
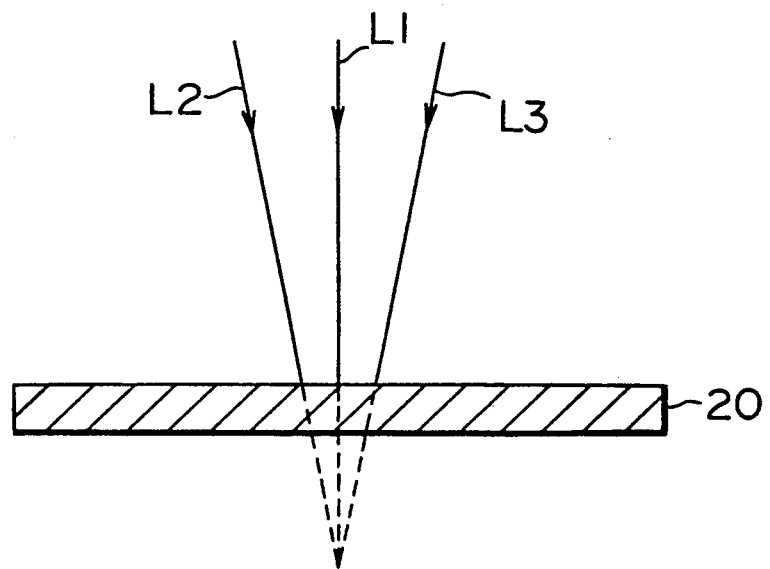
FIG. 6 is an enlarged view showing the surface of the wafer when the lights are defocused thereon.

On the other hand, when the light beams are not focused on the wafer 20 as shown in FIG. 6, the light beams L1-L3 do not converge at one point on the surface of the wafer 20. Thus, as indicated by dot chain lines of FIG. 5, the reverse components of light beams L2 and L3, transmitted through the phase shift member 23, are distributed only around the center of a portion where the light beam L1 is most intense. For this reason, only the intensity of light around a distribution line formed when the pupillary member 21 is not provided with the phase shift member 23 is offset by reverse components 29 and 30 of the light beams L2 and L3. In reality, the intensity of light is distributed as indicated by a solid line 27. For this reason, when the light beams are not focused, that is, when the light beams L1-L3 do not converge at one point on the surface of the wafer 20, only the intensity of light around a defocused image decreases. Then the image contrast is improved, so that it approaches the level of image contrast when the light beams are focused. In other words, an image of sharp contrast is obtainable in a wide optical axis direction, and the depth of focus (DOF) is enlarged.

The projection aligner shown in FIG. 1 permits enlargement of the DOF, as described above, while at the same time increasing the numerical aperture NA.

Figure 7:
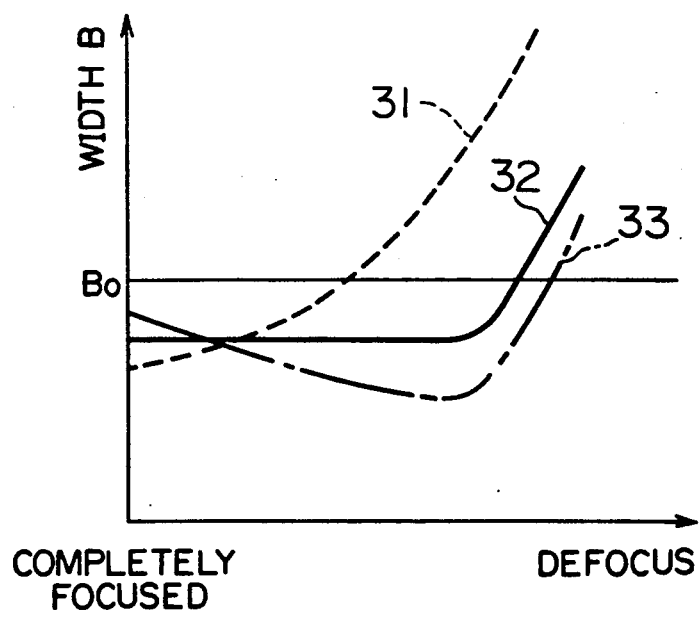
FIG. 7 is a view showing the result in which an optical image on the surface of the wafer is simulated when the width of a phase shift member of the pupillary member is changed.

The ratio of the width W of the phase shift member 23 to the radius A of the transmitting zone D of the pupillary member 21 is changed and an optical image contrast on the surface of the wafer 20 is simulated. FIG. 7 shows the results of the simulation. The abscissa of FIG. 7 indicates the degree of focus, the amount of defocus increasing toward the right. The ordinate indicates the width of a 25% distribution of the maximum intensity Ip, that is, one/fourth of the Ip of the optical image, as shown in FIG. 4. Symbol $B_O$ in FIG. 7 indicates an example of an allowable value of the width of the optical image when the circuit pattern is transcribed. An optical image having a width B not greater than the allowable value $B_O$ is required for accurate transcription.

In the case of W/A=0, that is, when the phase shift member 23 is not provided, as indicated by a broken line 31, the width B of the optical image increases sharply with a decrease in the degree of focusing, whereas the contrast decreases. In the case of W/A=5%, as indicated by a solid line 32, even when there is some decrease in the degree of focusing, the optical image exhibits a constant value which is substantially equal to the width B when the light beams are completely focused. The value then increases, exceeding the allowable value $B_O$. In the case of W/A=10%, as indicated by a dot chain line 33, as the degree of defocus increases, the width B of the optical image first decreases, and then increases and exceeds the allowable value $B_O$. The results of such a simulation prove that the use of the pupillary member 21 satisfying a relationship W/A=5% is effective in accurately and stably transcribing the circuit pattern.

The phase difference between light transmitted through the center of the transmitting zone D and light transmitted through a portion around the transmitting zone D, due to the phase shift member 23, is not limited to a half-wavelength. However, as described in the embodiment mentioned above, the use of the half-wavelength is the most effective in enlarging the DOF.

Figure 8:
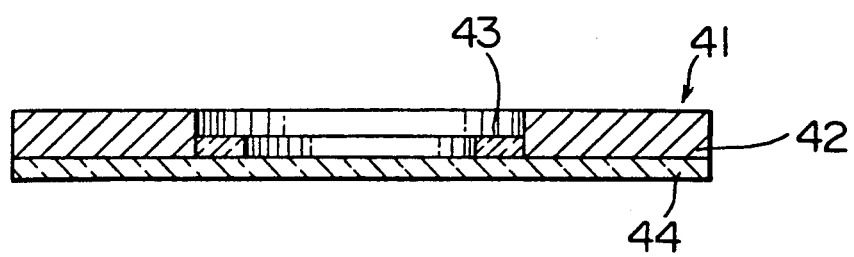
FIG. 8 is a cross-sectional view showing a pupillary member used in a second embodiment.

FIG. 8 shows a pupillary member 41 used in a second embodiment. The pupillary member 41 is constructed in such a way that an outer frame 42, and a phase shift member 43 are formed on the some crystalling substrate 44. In this embodiment, the deposition of $SiO_2$ on the crystal substrate 44 permits easy formation of the phase shift member 43.

Figure 9:
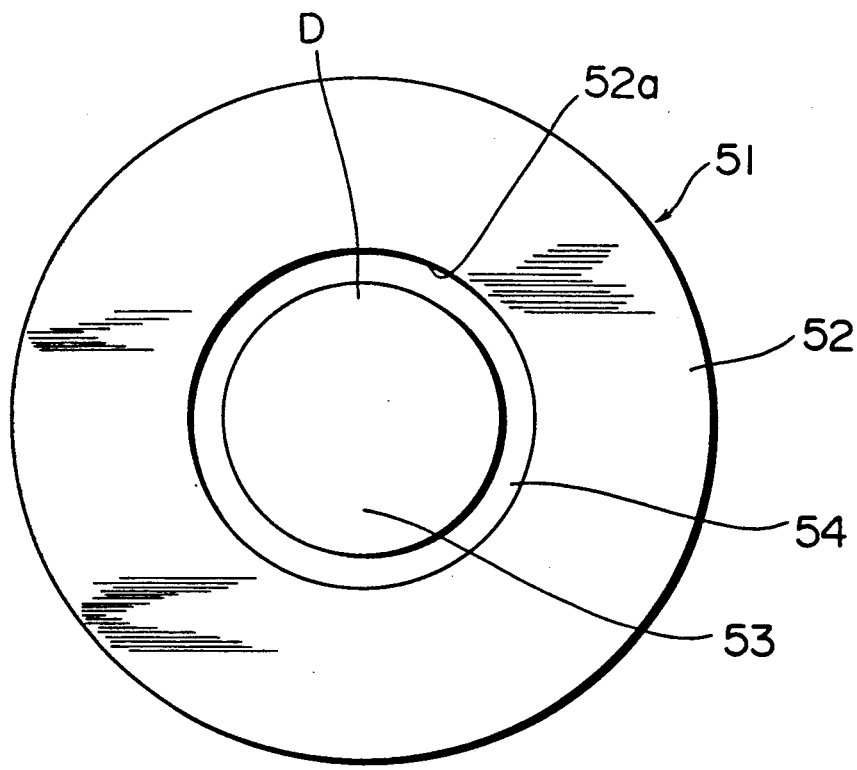
FIG. 9 is a plan view showing a pupillary member used in a third embodiment.
Figure 10:
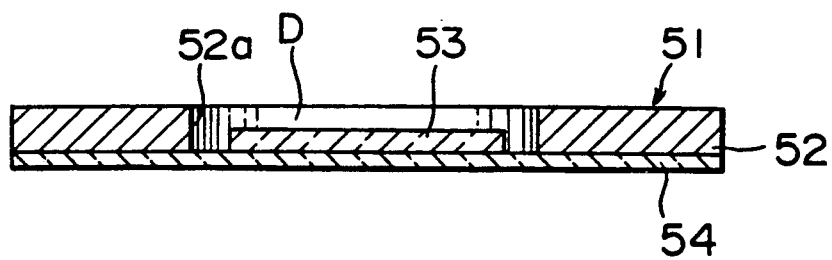
FIG. 10 is a cross-sectional view of the pupillary member shown in FIG. 9.

FIGS. 9 and 10 both show a pupillary member 51 used in a third embodiment. The pupillary member 51 is constructed in such a manner that a circular phase shift member 53 is formed at the center of a circular opening 52a in an outer frame. 52. The phase shift member 53 is formed on a crystalling substrate 54. In the pupillary member 51, as opposed to the pupillary member 21 shown in FIGS. 2 and 3, the phase of light transmitted through the center of a transmitting zone D is reversed with respect to the phase of light transmitted through a portion around the zone D. The same advantage as that described with the pupillary member 21 is obtainable.

Figure 11:
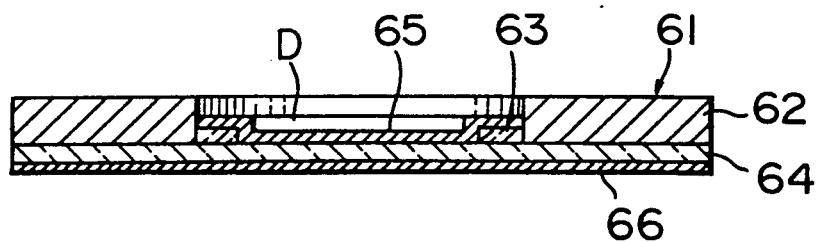
FIG. 11 is a cross-sectional view showing a pupillary member used in a fourth embodiment.

FIG. 11 shows a pupillary member 61 used in a fourth embodiment. The pupillary member 61 is constructed in the following way. First, an outer frame 62 and a phase shift member 63 are formed on a crystalling substrate 64. Then, antireflection films 65 and 66 made of, for example, $MgF_2$, are formed on the phase shift member 63 and the crystalling substrate 64 exposed outside. The formation of the antireflection films 65 and 66 reduces the amount of stray light, thus resulting in improved resolution and contrast of an image. The antireflection film may be formed on either the obverse or the reverse surface of a transmitting zone D. In FIG. 11, although the antireflection films are formed on the pupillary member with the structure shown in FIG. 8, they may be provided on any of the pupillary members with the structures described above. The same advantage as that described above is obtainable.

Figure 12:
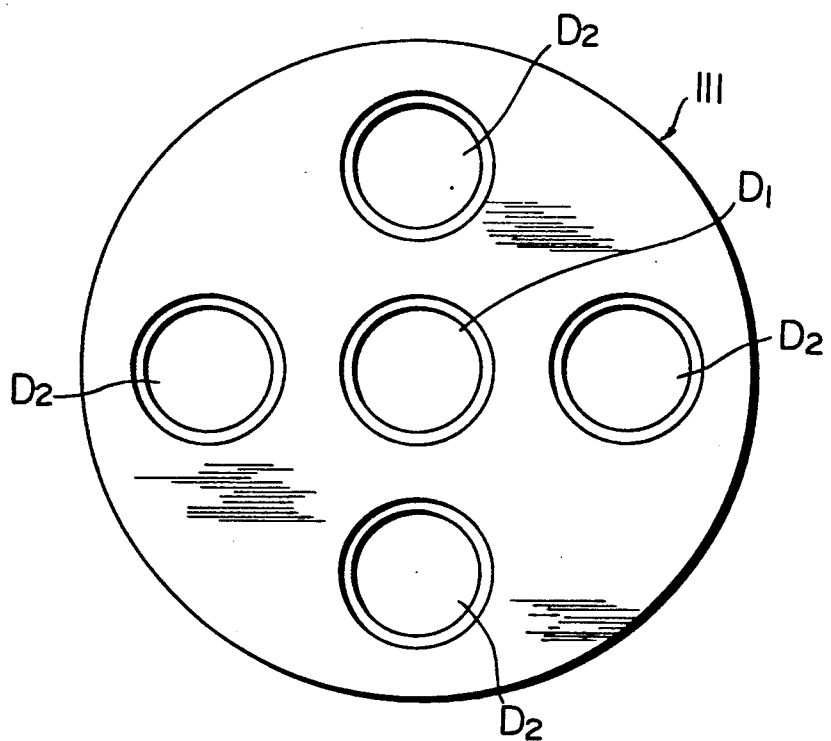
FIGS. 12 and 13 are plan views each showing pupillary members used in fifth and sixth embodiments.
Figure 13:
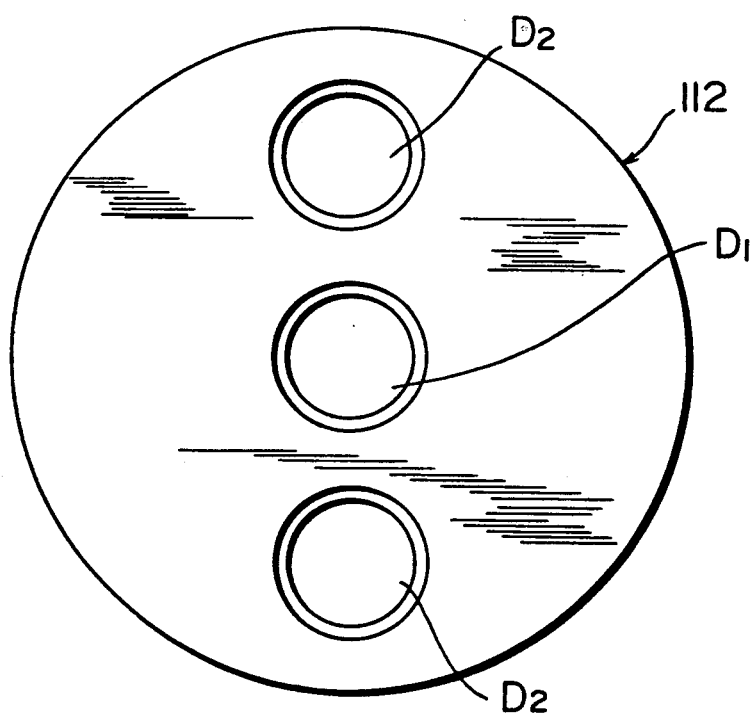

FIGS. 12 and 13 each show pupillary members used in fifth and sixth embodiments. If the circuit pattern formed on the mask 18 is a minute pattern, first order diffraction of light by this pattern has a great effect. That is, if it is a rectangular pattern, pattern images made by the first order diffracted light are formed around a pattern image made by zero order diffracted light; and if it is a line-and-space pattern, pattern images made by the first order diffracted light are formed on both sides of the pattern image made by the zero order diffracted light.

If a minute rectangular pattern is formed on the mask 18, as shown in FIG. 12, a pupillary member 111 may be employed. At the center of the member 111 a first transmitting zone $D_1$ for the zero order diffracted light is formed. Second transmitting zones $D_2$ for the first order diffraction of light are formed around the first transmitting zone $D_1$. On the other hand, if a minute line-and-space pattern is formed on the mask 18, as shown in FIG. 13, a pupillary member 112 may be employed, at the center of which member 112 a first transmitting zone $D_1$ for the zero order diffracted light is formed. Second transmitting zones $D_2$ for the first order diffracted light are formed on both sides of the first transmitting zone $D_1$. The respective transmitting zones $D_1$ and $D_2$ of the pupillary members 111 and 112 have structures similar to those of the pupillary members shown in FIGS. 2 and 3, and 8 to 11.

The use of such pupillary members 111 and 112 can reduce the intensity of light around the first order diffracted light of the circuit pattern, thus improving image contrast.

Figure 14:
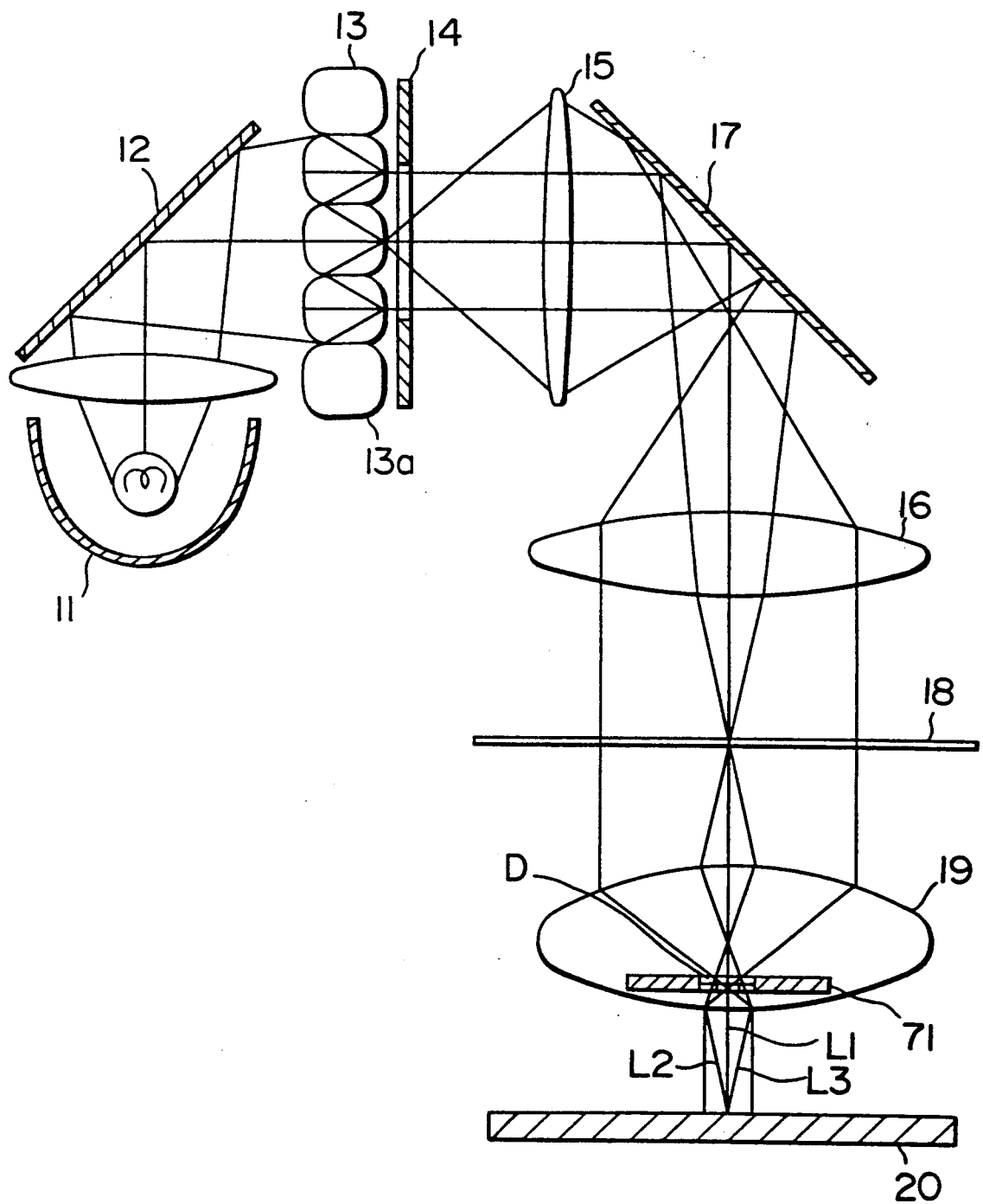
FIG. 14 is a view showing the optical system of a projection aligner in accordance with a seventh embodiment.
Figure 15:
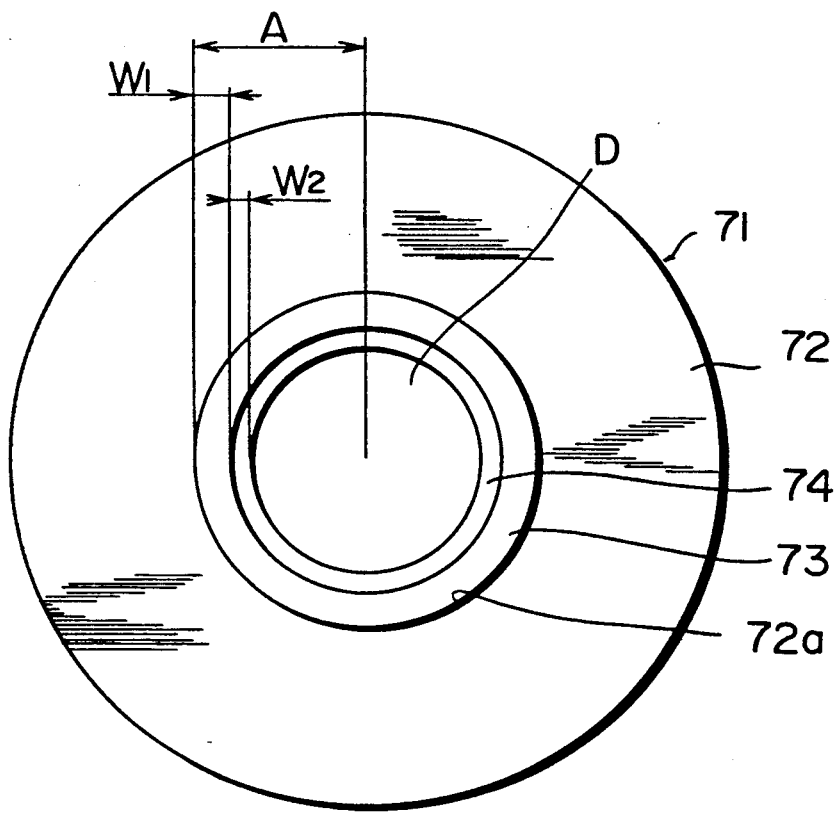
FIG. 15 is a plan view showing a pupillary member used in the seventh embodiment.
Figure 16:
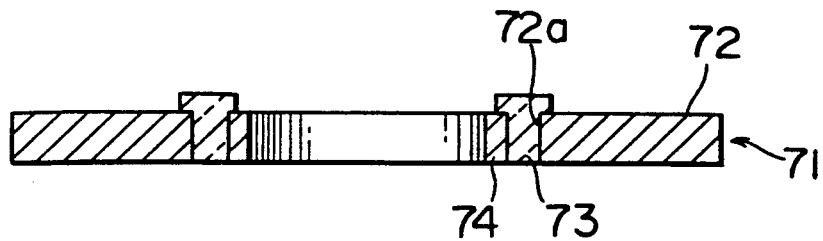
FIG. 16 is a cross-sectional view of the pupillary member shown in FIG. 15.

FIG. 14 is a view showing the optical system of a projection aligner in accordance with a seventh embodiment of this invention. In this embodiment, a pupillary member 71 is used in place of the pupillary member 21 of the optical system in the first embodiment shown in FIG. 1. As illustrated in FIGS. 15 and 16, the pupillary member 71 has a circular outer frame 72, an annular, phase shift member 73, and an annular light-intercepting i.e., opaque member 74. A circular opening 72a having a radius A is formed at the center of the outer frame 72. The phase shift member 73 having a width $W_1$ is formed around the periphery of the opening 72a. The light-intercepting member 74 having a width $W_2$ is formed around the inside periphery of the phase shift member 73. In other words, the center of a transmitting zone D is separated by the light-intercepting member 74 from a portion around the zone D. The outer frame 72 and the light-intercepting member 74 are made of a material, such as metal, which blocks light. The phase shift member 73 is made of, for instance, $SiO_2$.

Figure 17:
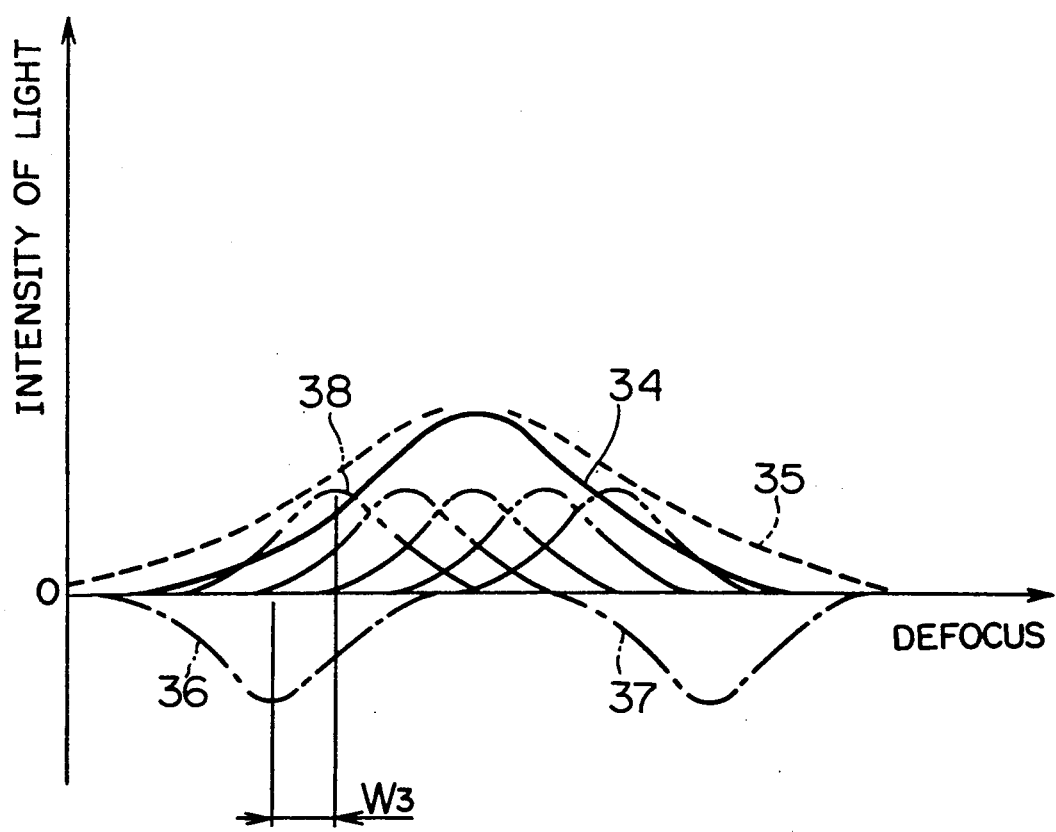
FIG. 17 is a view showing the distribution of the intensity of light on the surface of the wafer when the lights is not focused thereon according to the seventh embodiment.

When the pupillary member 71 having a such a light-intercepting member 74 is used, as indicated by dot chain lines of FIG. 17 when the light beams are not focused, the centers of reverse components 36 and 37 of light beams L2 and L3, transmitted through the phase shift member 73, will deviate in an amount equal to a predetermined distance $W_3$ from components 38 of a light beam L1 which are positioned most outwardly. For this reason, only light in a portion around a distribution line formed when the pupillary member 71 is not provided with the phase shift member 73 is offset by the reverse components 36 and 37 of the light beams L2 and L3. In reality, the intensity of light is distributed as indicated by a solid line 34. Thus, when the light beams are flat focused, only the intensity of light around a defocused image decreases, and the image contrast is considerably improved, so that it approaches the level of image contrast when the light beams are completely focused. In other words, an image of sharp contrast is obtainable in a wide optical axis direction, and the depth of focus (DOF) is enlarged.

The ratio $W_2/A$ of the width $W_2$ of the light-intercepting member 74 to the radius A of the transmitting zone D of the pupillary member 71 was changed and a circular contact hole pattern was exposed. It was found that when the ratio $W_2/A$ is about 3%, the circuit pattern can be most stably transcribed.

Figure 18:
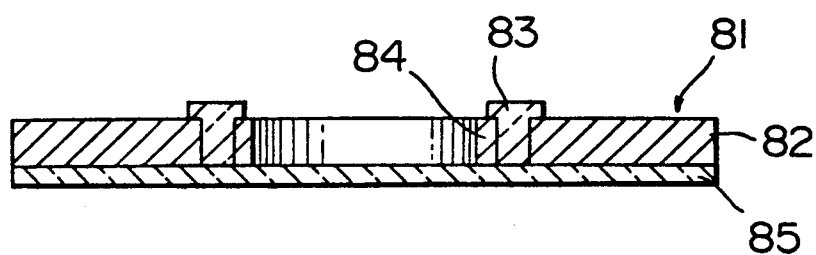
FIG. 18 is a cross-sectional view showing a pupillary member used in an eighth embodiment.

As shown in FIG. 18, it may also be possible to employ a pupillary member 81 constructed in such a way that an outer frame 82, a phase shift member 83, and a light-intercepting member 84 are formed on the same crystalling substrate 85. In such a case, the deposition of $SiO_2$ and metal on the crystalling substrate 85 permits easy formation of the phase shift member 83 and the light-intercepting member 84.

Figure 19:
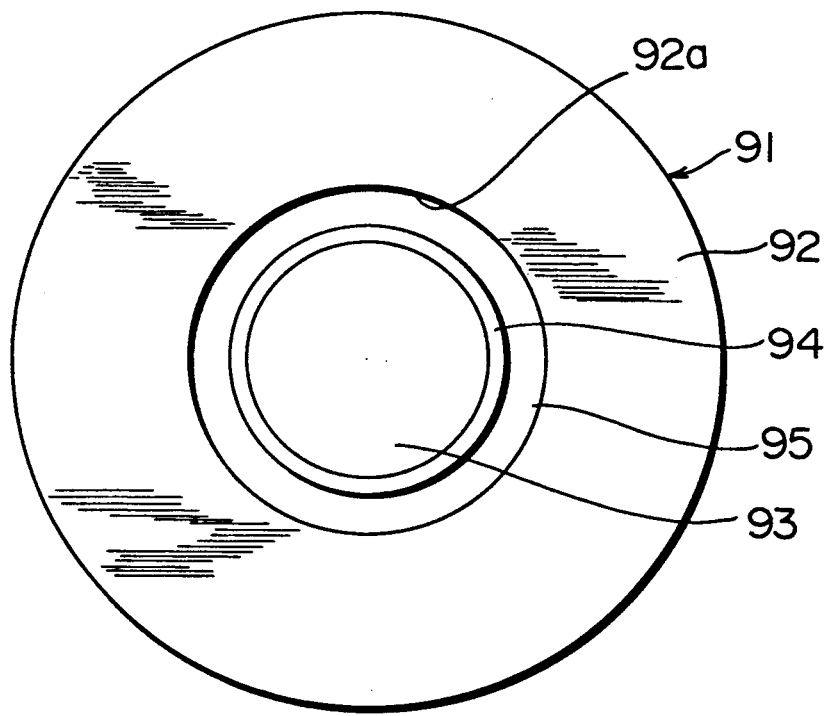
FIG. 19 is a plan view showing a pupillary member used in a ninth embodiment.
Figure 20:
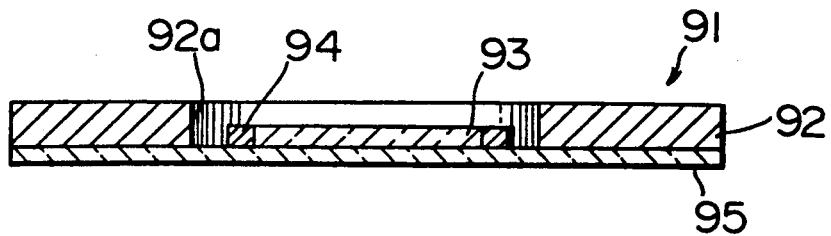
FIG. 20 is a cross-sectional view of the pupillary member shown in FIG. 19.

Alternatively, as in a pupillary member 91 shown in FIGS. 19 and 20, a circular phase shift member 93 may be formed at the center of a circular opening 92a in an outer frame 92 and a light-intercepting member 94 may be formed around the phase shift member 93. The phase shift member 93 and the light-intercepting member 94 are formed on a crystalling substrate 95.

Figure 21:
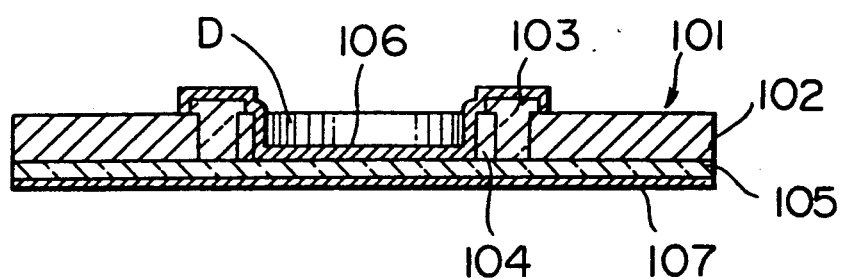
FIG. 21 is a cross-sectional view showing a pupillary member used in tenth embodiment.

As in a pupillary member 101 depicted in FIG. 21, the formation of antireflection films 106 and 107 made of, for example, MgF$_2$, reduces the amount of stray light, thus resulting in improved resolution and contrast of an image. In the pupillary member 101, first, an outer frame 102, a phase shift member 103, and a light-intercepting member 104 are formed on a crystalling substrate 105. Then, the antireflection film 106 is formed on the phase shift member 103, the light-intercepting member 104 and the obverse side of the crystalling substrate 105, and the antireflection film 107 is formed on the reverse side of the crystalling substrate 105. The antireflection film may be formed on either the obverse or the reverse surface of a transmitting zone D. In FIG. 21, although the antireflection films are formed on the pupillary member with the structure shown in FIG. 18, they may be provided on a pupillary member with a different structure. The same advantage as that described above is obtainable.

Figure 22:
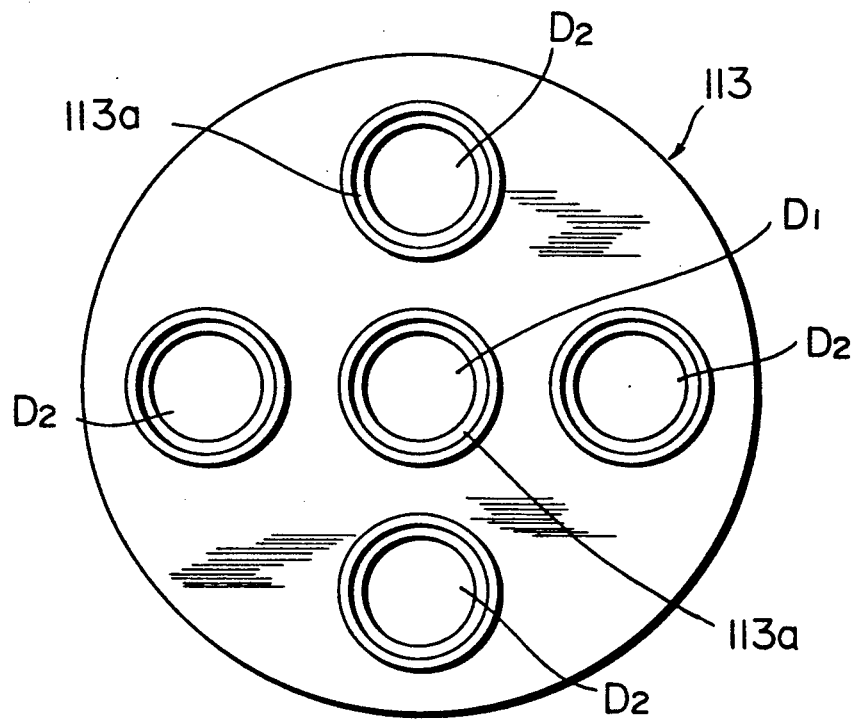
FIGS. 22 and 23 are plan views each showing pupillary members used in eleventh and twelfth embodiments.
Figure 23:
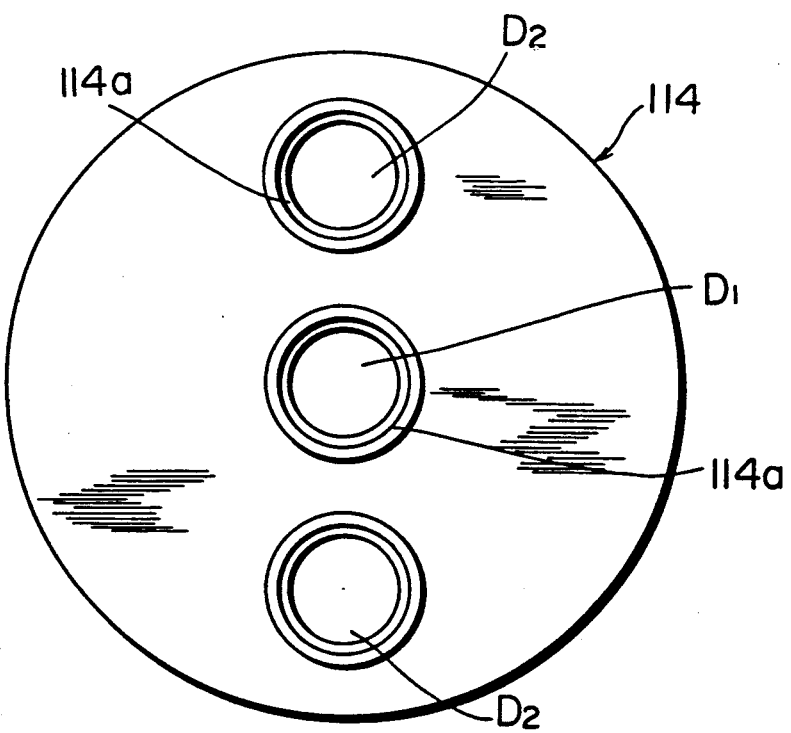
Figure 24:
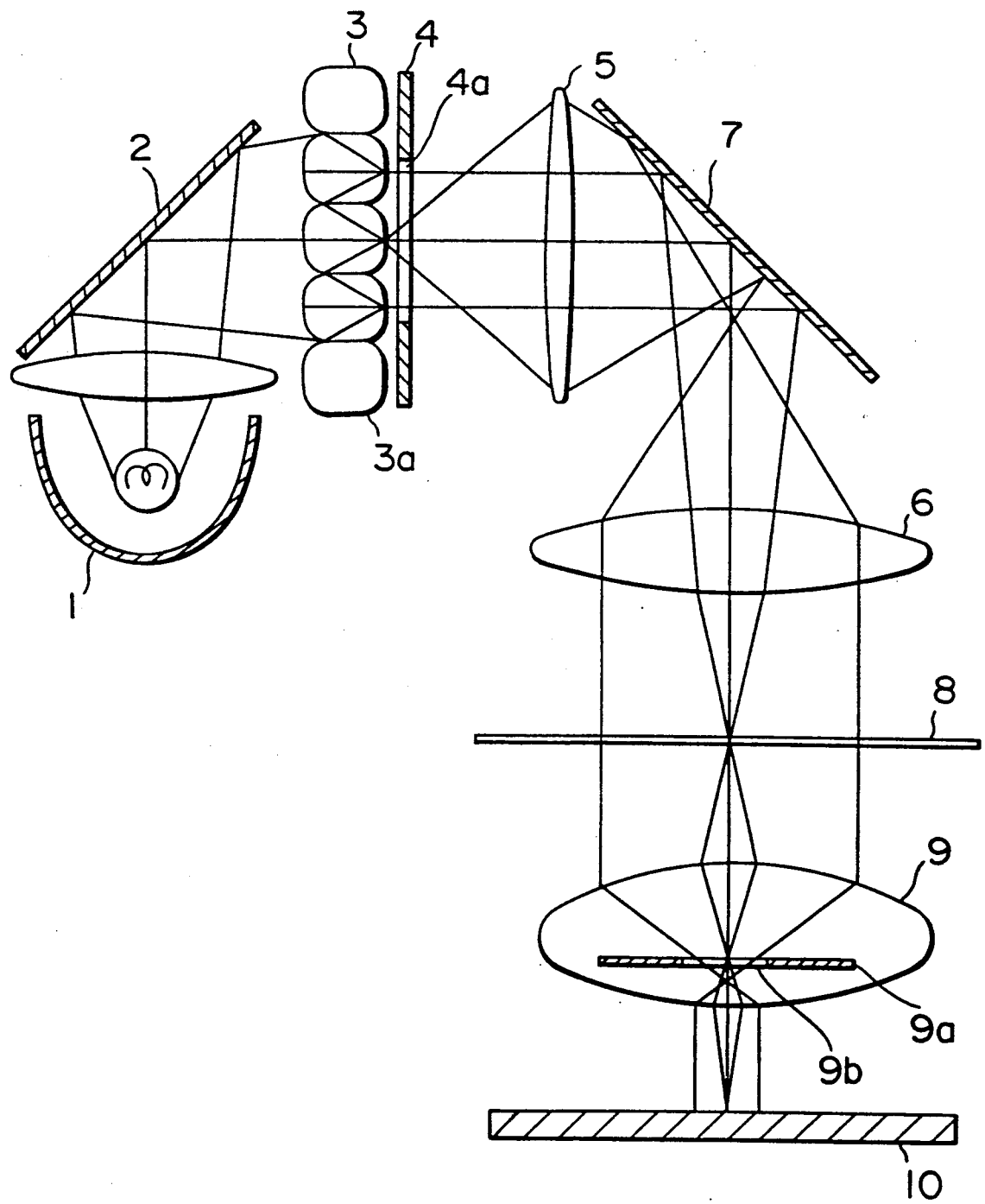
FIG. 24 is a view showing the optical system of the conventional projection aligner.
Figure 25:
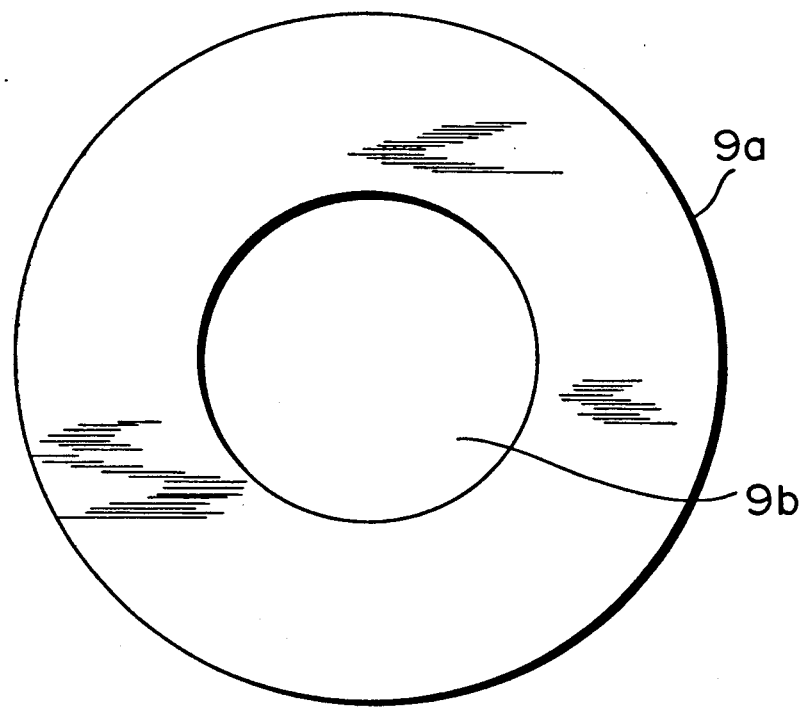
FIG. 25 is a plan view of a pupillary member used in the aligner shown in FIG. 24.
Figure 26:
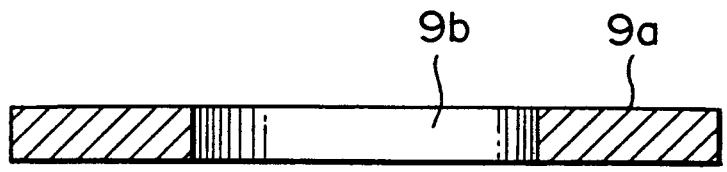
FIG. 26 is a cross-sectional view of the pupillary member shown in FIG. 25.

As shown in FIG. 22, the use of a pupillary member 113 effectively improves image contrast when the minute rectangular pattern is formed on the mask 18. The pupillary member 113 has a primary transmitting zone $D_1$ for the zero order diffracted light, and four secondary transmitting zones $D_2$ for the first order diffracted light. A light-intercepting member 113a for separating the center of each zone from a portion around this center is formed in each of the transmitting zones $D_1$ and $D_2$. On the other hand, as shown in FIG. 23, the use of a pupillary member 114 effectively improves image contrast when the minute line-and-space pattern is formed on the mask 18. The pupillary member 114 has a primary transmitting zone $D_1$ for the zero order diffracted light, and two secondary transmitting zones $D_2$ for the first order diffracted light. A light-intercepting member 114a for separating the center of each zone from a portion around this center is formed in each of the transmitting zones $D_1$ and $D_2$. The respective transmitting zones $D_1$ and $D_2$ of the pupillary members 113 and 114 have structures similar to those of the pupillary members shown in FIGS. 15 and 16, and 18 to 21.

What is claimed is:

1. A projection aligner comprising:
   a light source for producing light;
   a condenser lens system for directing light from said light source onto a mask on which a circuit pattern is formed;
   a projecting lens system for collecting on the surface of a wafer the light transmitted through said mask; and
   a pupillary member disposed on a pupillary surface of said projecting lens system, said pupillary member including at least one transmitting zone for transmitting light transmitted through said mask and a phase shift member disposed within part of the transmitting zone for producing a predetermined phase shift in light transmitted through part of the transmitting zone.

2. A projection aligner as claimed in claim 1 wherein said phase shift member is an annular member defining a periphery of the transmitting zone of said pupillary member.

3. A projection aligner as claimed in claim 1 wherein said phase shift member is a disk-like member and the transmitting zone of said pupillary member surrounds said phase shift member.

4. A projection aligner as claimed in claim 1 wherein said phase shift member produces a phase difference of one-half wavelength.

5. A projection aligner as claimed in claim 1 wherein said phase shift member is SiO$_2$.

6. A projection aligner as claimed in claim 1 wherein said pupillary member includes an annular light-intercepting member within the transmitting zone.

7. A projection aligner as claimed in claim 6 wherein said light-intercepting member is metal.

8. A projection aligner as claimed in claim 1 wherein said pupillary member includes a transparent substrate, a frame disposed on said transparent substrate and having an opening defining the transmitting zone, and said phase shift member is disposed on said transparent substrate within the opening of said frame.

9. A projection aligner as claimed in claim 8 wherein said transparent substrate is quartz and said outer frame is metal.

10. A projection aligner as claimed in claim 1 wherein said pupillary member includes an antireflection film within the transmitting zone.

11. A projection aligner as claimed in claim 10 wherein said antireflection film is MgF$_2$.

12. A projection aligner as claimed in claim 2 wherein the transmitting zone is circular and has a radius A, said annular phase shift member has a width $W_1$, and the ratio $W_1/A$ is substantially 5%.

13. A projection aligner as claimed in claim 6 wherein the transmitting zone is circular and has a radius A, said annular light-intercepting member has a width $W_2$ and is concentric with the transmitting zone, and the ratio $W_2/A$ is substantially 3%.

14. A projection aligner as claimed in claim 1 wherein said transmitting zone includes a first transmitting zone for zero order diffracted light and a plurality of second transmitting zones for first order diffracted light.

15. A projection aligner as claimed in claim 14 wherein said first transmitting zone is disposed at the center of said pupillary member and including four second transmitting zones disposed circumferentially with respect to the first transmitting zone.

16. A projection aligner as claimed in claim 14 wherein the first transmitting zone is disposed at the center of said pupillary member and including two second transmitting zones disposed on opposite sides of the first transmitting zone.

17. A projection aligner as claimed in claim 14 wherein said first and second transmitting zones each include light-intercepting members within the respective transmitting zones.

* * * * *